(12) United States Patent
Polzin

(10) Patent No.: US 7,755,355 B2
(45) Date of Patent: *Jul. 13, 2010

(54) METHOD AND SYSTEM OF ENHANCED PHASE SUPPRESSION FOR PHASE-CONTRAST MR IMAGING

(75) Inventor: Jason A. Polzin, Lake Mills, WI (US)

(73) Assignee: General Electric Company, Schenectady, NY (US)

( * ) Notice: Subject to any disclaimer, the term of this patent is extended or adjusted under 35 U.S.C. 154(b) by 205 days.

This patent is subject to a terminal disclaimer.

(21) Appl. No.: 11/933,520

(22) Filed: Nov. 1, 2007

(65) Prior Publication Data

US 2008/0054900 A1 Mar. 6, 2008

Related U.S. Application Data

(63) Continuation of application No. 10/711,603, filed on Sep. 28, 2004, now Pat. No. 7,292,032.

(51) Int. Cl.
G01V 3/00 (2006.01)
(52) U.S. Cl. ...................................... 324/306; 600/419
(58) Field of Classification Search ................. 324/306, 324/307, 309; 600/419
See application file for complete search history.

(56) References Cited

U.S. PATENT DOCUMENTS

| 4,870,361 A | 9/1989 | In Den Kleef et al. |
| 4,876,507 A | 10/1989 | Van Vaals |
| 4,954,779 A | 9/1990 | Zur |
| 5,113,865 A | 5/1992 | Maeda et al. |
| 5,115,812 A | 5/1992 | Sano et al. |
| 5,226,418 A | 7/1993 | Bernstein et al. |
| 5,375,598 A | 12/1994 | Dumoulin et al. |
| 5,498,963 A | 3/1996 | Schneider et al. |
| 5,521,502 A | 5/1996 | Siegel, Jr. et al. |
| 6,397,096 B1 | 5/2002 | Liu et al. |
| 7,112,964 B2 * | 9/2006 | Zhou et al. ................. 324/307 |

OTHER PUBLICATIONS

Walker et al., "Semiautomated Method for Noise Reduction and Background Phase Error Correction in MR Phase Velocity Data," JMRI (1993), vol. 3, No. 3, pp. 521-530.

* cited by examiner

Primary Examiner—Louis M Arana
(74) Attorney, Agent, or Firm—Ziolkowski Patent Solutions Group, SC

(57) ABSTRACT

An automated image processing technique is disclosed that evaluates pixels of a phase-difference image to determine those pixels corresponding to inflowing phase data and background phase data. Phase-difference images are generated from a first acquisition and a second acquisition. Non-zero spatially varying background phase from the phase-difference images that are due to eddy currents induced by flow encoding gradients used to generate the phase-difference images is determined. This non-zero spatially varying background phase is removed from the phase-difference images to determine phase associated with flowing spins and phase associated with stationary spins.

20 Claims, 5 Drawing Sheets

METHOD AND SYSTEM OF ENHANCED PHASE SUPPRESSION FOR PHASE-CONTRAST MR IMAGING

CROSS-REFERENCE TO RELATED APPLICATION

The present application is a continuation of and claims priority of U.S. Ser. No. 10/711,603 filed Sep. 28, 2004, the disclosure of which is incorporated herein by reference.

BACKGROUND OF THE INVENTION

The present invention relates generally to diagnostic imaging and, more particularly, to a method and system of MR imaging with enhanced flow contrast. The present invention is well-adapted to reconstructing phase-contrast MR images with the suppression of non-zero spatially varying background phase occurring in phase-difference images primarily attributable to eddy currents resulting from the application of magnetic gradients to encode flowing nuclei to static tissue. Moreover, the present invention provides an effective technique to quantitatively assess flow velocities in vivo more accurately.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", Mz, may be rotated, or "tipped", into the x-y plane to produce a net transverse magnetic moment Mt. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well-known reconstruction techniques.

Phase contrast (PC) imaging is an MR acquisition and reconstruction technique that uses flow-encoding gradients with a non-zero first moment to encode spins with a phase proportional to their velocity, $\phi_v = 2\pi\gamma M_1 v$, where v is the spin velocity, $M_1$ is the gradient first-moment, and $\gamma$ is the gyromagnetic ratio for protons. The gradient first moment can be calculated from the gradient strength, G, as $M_1 = \int_0^{TE} G(t) t \, dt$. As such, in a reconstructed PC image, spins flowing at faster velocities may be distinguished from slower flowing spins and from stationary spins. In this regard, PC imaging is commonly used to quantitatively assess flow velocities in vivo. PC imaging is also used to determine the shape of a corpus having flow therethrough.

In MR imaging there are many different sources of phase including differences between the transmit and receive phase, data acquisition window alignment, imperfect slice-selection, filtering, and eddy currents. Typically in PC, to remove these other sources of phase, two separate acquisitions with different first moments and the same zeroth moment (area) are used to remove the phase contribution.

There are two different reconstruction methods for PC, complex-difference (CD) reconstruction and phase-difference (PD) reconstruction. In CD reconstruction, the magnitude of the complex signal difference is calculated from each of the two flow-encoded acquisitions. CD images have zero signal in regions of stationary spins and a non-zero signal proportional to the transverse magnetization and the sine of the velocity-induced phase shift. In PD reconstruction, the difference of the phase from each acquisition is calculated, as $\Delta\phi_v = \arg(Z_1 Z_2^*)$, where $Z_1$ and $Z_2$ represent the first and second flow-encoded acquisitions, * refers to the complex conjugate, and arg is the phase angle. This is equivalent to $\Delta\phi_v = 2\pi\gamma\Delta M_1 v$, where $\Delta M_1$ is the difference in the first moments between the two acquisitions. The velocity-encoding value or $v_{enc}$ is defined as the velocity at which spins will be imparted with a phase angle of $\pi$ radians, or $v_{enc} = \frac{1}{2\gamma\Delta M_1}$.

Notwithstanding its robustness, phase attributable to eddy currents induced by the flow-encoding gradients themselves is not removed with PD correction. Since these flow-encoding gradients differ between the two separate acquisitions, the eddy currents do not cancel one another when the two separate acquisitions are combined. As a result, the residual eddy currents may manifest themselves as non-zero spatially varying background phase in the PD images. This non-zero background phase is in addition to the phase accumulated by moving spins and can affect the precision of quantitative assessments.

Conventionally, background phase in a PD image is estimated by performing a first-order (or higher) polynomial fit to the image phase. This fit can then be subtracted from the PD image to assess or otherwise remove the background phase. However, this fitting does not distinguish between phase due to actual flowing spins and residual background phase. As such, the determination of the background phase can be effectively over- or under-calculated. In this regard, the presence of phase due to flowing spins can perturb the results of any assessment of the background phase. As a result, quantitative assessment of flow velocities can be affected by the eddy current-induced phase. Accordingly, background phase correction is not usually carried out for quantitative flow protocols.

One proposed solution to correct background phase influences on a PD image is to image a phantom with the same scan parameters used to image the subject. From the phantom scan, background phase is determined and is used to remove the background phase from the PD. While reasonably effective, separately scanning a phantom increases scan time, decreases throughput, and requires additional scanner setup and operator involvement.

Therefore, it would be desirable to have a system and method capable of discriminating between the phase of inflowing spins and the phase of background spins such that background phase correction may be effectively applied for quantitative assessments of flow velocities in vivo.

BRIEF DESCRIPTION OF THE INVENTION

The present invention provides a system and method of differentiating between flow induced phase and background phase for correction of PC images that overcome the aforementioned drawbacks.

An automated image processing technique is disclosed that evaluates the pixel phase from a PD image for contributions from flow and non-flow induced sources. From the temporal frequency components of each pixel, a power spectrum of the pixel is generated and evaluated. The power spectrum is evaluated to differentiate between pixels containing predominantly flow induced phase data and pixels containing predominantly background phase data. From this segmentation, the present invention provides a mask image that can be used to subtract background phase from the PD image. Subtraction can be carried out in each direction of flow and, in the context of cardiac or blood flow imaging, for each phase of a cardiac cycle.

Therefore, in accordance with an aspect of the present invention, an MR scanner includes an MRI system having a plurality of gradient coils positioned about a bore of a magnet to impress a polarizing magnetic field and an RF transceiver system. The MR scanner also includes a computer programmed to generate PD images from a first acquisition and a second acquisition and determine a non-zero spatially varying background phase from the PD images that are due to eddy currents induced by flow encoding gradients used to generate the PD images. The computer is also programmed to remove the non-zero background phase from the PD images and determine phase associated with flowing spins and phase associated with stationary spins.

In accordance with another aspect, the present invention includes a method of phase correction in flow analysis MR imaging. The method includes the step of determining temporal frequency components for a given pixel of a phase-difference image. The method also includes generating a power spectrum of the given pixel from the temporal frequency components and determining a percentage of the power spectrum within a given energy range. The method also includes the step of including the pixel in a mask image if a given percentage of the power spectrum for the pixel is at a given energy. In an alternate aspect, selected harmonics of the power spectrum of the given pixel are summed and normalized to a maximum pixel value in the phase-difference image. From this normalization, background pixels are distinguished from flow pixels.

In accordance with another aspect, the invention is embodied in a computer program stored on a computer readable storage medium and having instructions which, when executed by a computer, cause the computer to determine a pulsatility factor for each pixel of a slice of a PD image. The computer is also caused to generate a mask image of the slice from only those pixels having a pulsatility factor below some nominal value and apply the mask image to the phase-difference image for the slice to mask the PD image along the slice. The set of instructions further causes the computer to reiterate these acts for each slice of the PD image and output a corrected PD image with substantial subtraction of background phase.

Various other features, objects, and advantages of the present invention will be made apparent from the following detailed description and the drawings.

BRIEF DESCRIPTION OF THE DRAWINGS

The drawings illustrate one preferred embodiment presently contemplated for carrying out the invention.

In the drawings.

DETAILED DESCRIPTION OF THE PREFERRED EMBODIMENT

Figure 1:
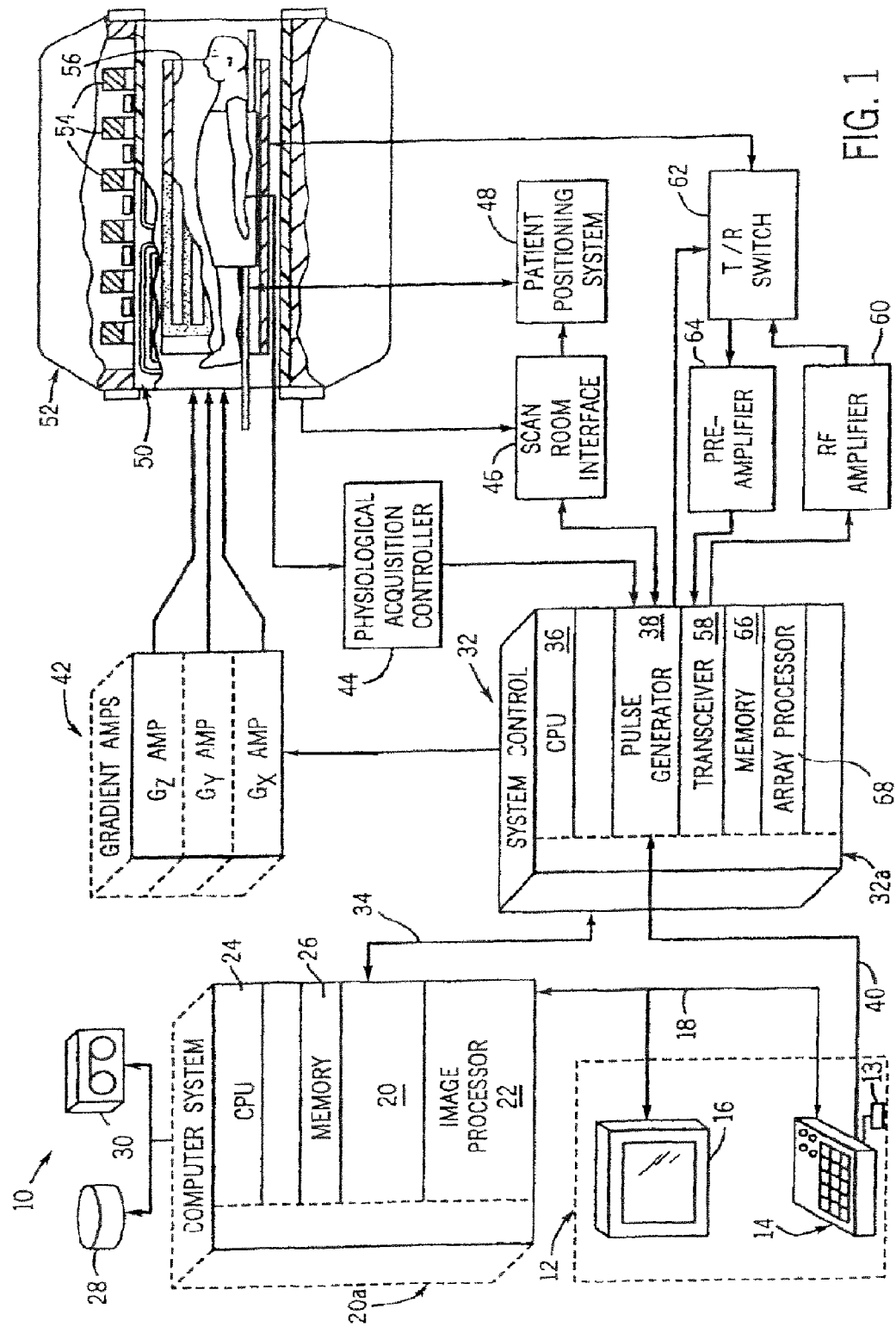
FIG. 1 is a schematic block diagram of an MR imaging system for use with the present invention.

Referring to FIG. 1, the major components of a preferred magnetic resonance imaging (MRI) system 10 incorporating the present invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 is linked to disk storage 28 and tape drive 30 for storage of image data and programs, and communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having $G_x$, $G_y$, and $G_z$ amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory, such as disk storage 28. In response to commands received from the operator console 12, this image data may be archived in long term storage, such as on the tape drive 30, or it may be further processed by the image processor 22 and conveyed to the operator console 12 and presented on the display 16.

The present invention is directed to an automated image processing technique designed to discriminate between flowing spins and stationary background spins that may be carried out on MR data acquired with the scanner of FIG. 1 or other equivalent imaging system. While phase-based image segmentation will be described, it is contemplated that segmentation may be carried out as a function of the magnitude of flowing spins versus background spins. With magnitude-based segmentation, an object known to include flowing spins, such as a blood vessel, could be distinguished from other anatomical features based on the general shape of the object, e.g. round. In contrast, phase-based segmentation is predicated upon variations in phase to locate and/or identify a particular anatomical object. That is, from empirical data, it is known that certain phase variations can be expected in a blood vessel. As such, once cognizant of the phase variations, it is possible to determine what type of object is undergoing the variations in phase or quantify flow in the object.

As will be described, an automated background correction technique is disclosed that segments objects within a PD image based on a degree of pulsatility and, as such, excludes an object from a background phase fit or correction if the degree of pulsatility indicates flow through the object. For instance, blood and other fluids typically pulsate while flowing through a subject. This pulsatility can then be exploited to identify and differentiate blood or other fluid flow from stationary tissue. It is recognized that a number of approaches may be taken to determine or otherwise estimate flow pulsatility. In one approach, a temporal frequency power spectrum is used to determine pulsatility. In this regard, for a given pixel location within a PD image, if a given fraction of the signal is at a given energy level or within a given energy range, then the pixel is deemed to correspond to a region of pulsatile flow and is, therefore, excluded from a background phase fit.

Figure 2:
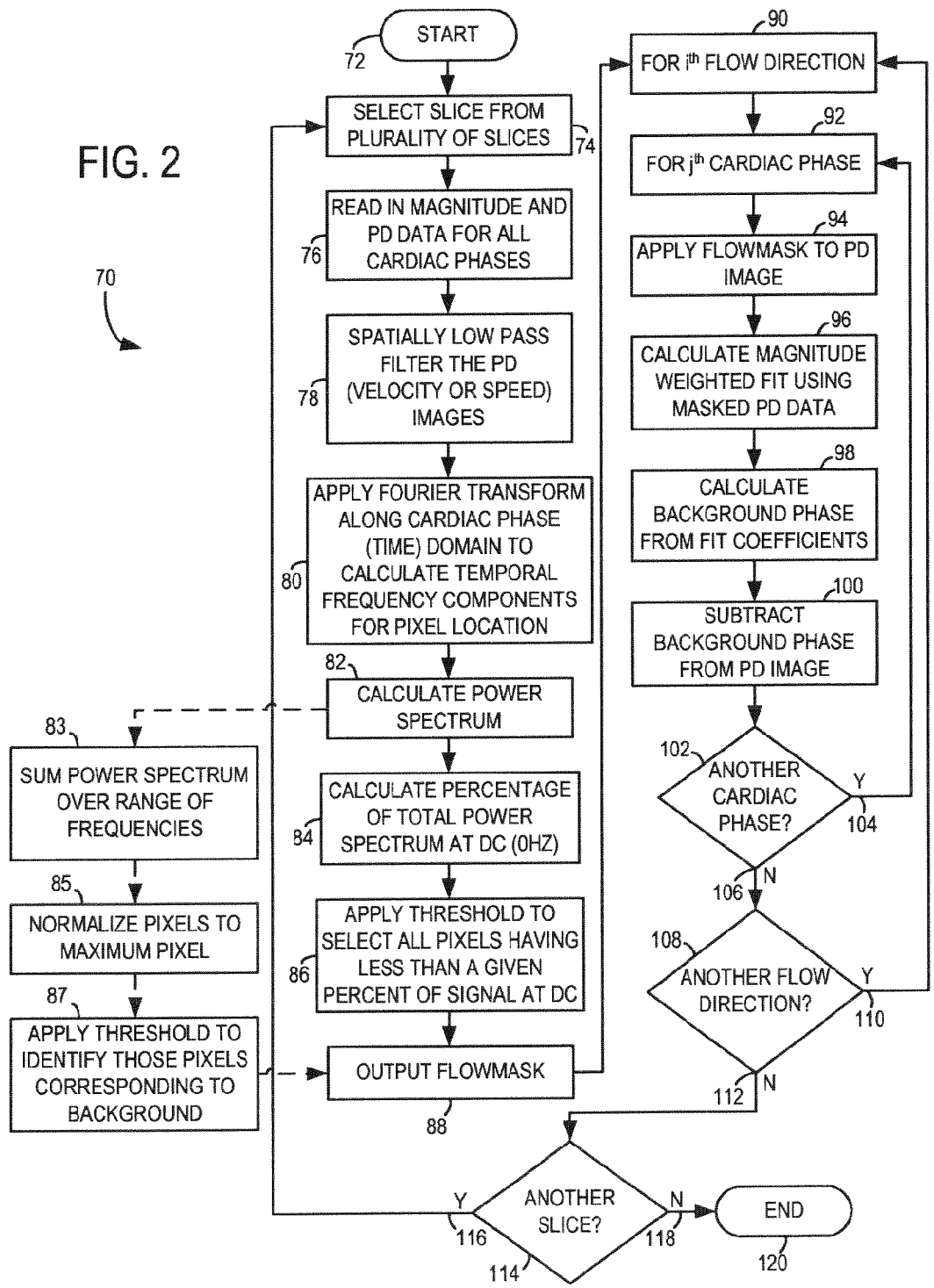
FIG. 2 is a flow chart setting forth the steps of a background subtraction technique according to one embodiment of the invention.

Referring now to FIG. 2, the steps of an automated background phase correction technique are set forth. Background suppression technique 70 is a post-processing technique that is carried out after the acquisition of MR data. Accordingly, technique 70 commences at 72 at the completion of data acquisition. Moreover, processing technique 70 is preferably carried out on a per slice basis. As such, a slice for background phase correction is selected at 74. For the selected slice, magnitude and PD data for all measured cardiac cycles are input or otherwise read in 76 for evaluation. The PD image is then spatially filtered to reduce noise in the image 78. It is recognized that since a low-order polynomial background fit will be used, spatially filtering the PD image does not affect the accuracy or implementation of the background fit. A number of filters may be used including, but not limited to a 4×4 low-pass boxcar filter. Wiener and median filters may also be used. Generally, noise reduction is achieved by converting the magnitude and phase image data to a complex image using the expression: $s=me^{j\pi v/venc}$, where v is the measured pixel velocity, m is the magnitude signal value, and venc is the velocity encoding. The resulting complex image is then low-pass filtered and converted back to a phase image, $$v_{filt} = venc/(\pi \arg(s)).$$

A Fourier Transform is then applied 80 to the phase image along the time (cardiac phase) dimension. From the Fourier Transform, a 3D dataset is provided. The dataset includes spatial pixel location data along two dimensions and temporal frequency data along the third dimension. From the temporal frequency data, a power spectrum is calculated or otherwise determined 82 as the product of the temporal frequency data and its complex conjugate. The power spectrum is the evaluated to determine those pixels having data predominantly corresponding to flowing spins or data predominantly corresponding to static spins.

In one embodiment, those pixels having a certain percentage of their power spectrum at DC or zero Hertz are deemed to be the pixels predominantly composed of static or non-flowing spins. In this regard, the power spectrum for each pixel within the slice is evaluated at 84 to calculate or otherwise determine what percentage of each pixel's energy is at DC or zero Hertz. In one embodiment, those pixels having more than 15 percent of their power spectrum above DC are deemed to be pixels of predominantly flowing spins. In this regard, these pixels are deemed to have a higher pulsatility index (PI) and, as such, are more pulsatile. A pixel's PI can be calculated as $PI(\%) = 100\% - A$, where A corresponds to the percentage of a given pixel's energy at DC or zero Hertz. Further, the power spectrum of each pixel is applied against a threshold 86 to identify those pixels within the selected slice predominantly composed of non-flowing, static spins for inclusion in a mask image 88 that will be used for background correction in the PD image of the slice.

A mask image is generated 88 that is applied to each PD image for each cardiac phase measured and for each direction of flow through the slice. As such, following generation of flow mask 88, a given (ith) flow direction is selected 90. For the given flow direction, a given (jth) cardiac phase is also selected 92. The mask is then applied against the PD image for the given cardiac phase along the given flow direction 94 to yield masked PD data. More specifically, the pixels in the mask image mask or cancel corresponding pixels in the PD image. The remaining pixels may then be fit using a magnitude weighted least-squares approach to provide a low order polynomial expression of the remaining pixels 96. An exemplary second order polynomial expression may be expressed as:

$$\phi(I,J) = c_1 + c_2 I + c_3 J + c_4 I^2 + c_5 J^2 + c_6 IJ,$$

where I and J are pixel indices and $c_n$ are the coefficients. This polynomial is then evaluated at 98 for each pixel to determine background phase in the masked, non-flowing data. This background phase is then subtracted from the PD image 100 resulting in a corrected PD image for the selected slice along the given flow direction for the given cardiac phase.

As each slice or spatial location of the PD image may include MR data acquired for multiple cardiac phases and along multiple flow directions, technique 70 continues at 102 to determine if another cardiac phase of data is to be evaluated for the given spatial location. If so 102, 104, technique loops back to step 92 with reapplication of the mask image to the PD image of the next cardiac phase. This loop will reiterate until each measured cardiac phase for the given direction of flow is corrected. As such, after all the cardiac phases for the given flow direction are evaluated 102, 106, technique 70 determines if another flow direction for the selected slice remains to be evaluated 108. If so 108, 110, the background correction technique returns to steps 90-106 with background subtraction for the next flow direction. This process will reiterate until each flow direction for the given slice is evaluated. As will be described below, in those situations where the given spatial location has multiple directions of flow, a "speed" based mask image will be applied. That is, for spatial locations having only one direction of flow, a velocity image is used, but for spatial locations having multiple directions of flow, a speed image, which is the square root of the sum of the squares of the velocity image, is used.

Once all flow directions for the given slice or spatial location are considered 108, 112, the background correction technique 70 determines if another slice or spatial location is to be evaluated 114. If so 114, 116, steps 74-112 are reiterated until all the flow directions (and all cardiac phases) in the next slice are evaluated. After all slices have been evaluated 114, 118, a corrected PD image is reconstructed and output at 120, whereupon background correction is complete. The corrected PD image may then be used to quantitatively assess flow velocities in the image with improved precision as the non-zero spatially varying background phase resulting from the flow-encoding gradients has been substantially removed from the PD image.

Referring again to FIG. 2, in another embodiment (shown in phantom), the individual harmonics from the temporal power spectrum determined at 82 are used to distinguish between background and flow. Specifically, in one embodiment, the power spectrum for the first and second harmonics is summed at 83. The zeroth harmonic contains the average signal, the first harmonic contains the signal with a period equal to the cardiac cycle, and the second harmonic contains the signal with a period twice the cardiac cycle. It is contemplated, however, that the power spectrum from more than the first and the second harmonics may be summed. Once the selected harmonics are summed for each pixel, the sums are normalized to the maximum pixel in the image 85. This is achieved by taking the ratio of each pixel to the maximum pixel found in the summed image. As a result of this normalizing, each pixel will have a normalized value in the range of 0.0-1.0. A threshold may then be applied at 87 to identify those pixels corresponding to background and those corresponding to flow. For example, by selecting a threshold value of 0.04-0.05, those pixels having a normalized valued below this threshold would be considered a background pixel and anything above the threshold would be considered a flow pixel. A background mask containing all pixels below the threshold may then be output at 88, whereupon the process continues as described above.

It is recognized that the threshold may be pre-selected or determined on-the-fly. That is, the threshold may be set to a given value prior to data acquisition or as determined from a scout scan. Alternately, the threshold value may be determined after each pixel has been normalized.

As described above, a mask image may be generated from identifying those pixels having a given fraction of their energy level at or above a given level, e.g. zero Hertz or pixels with a significant fraction of their energy within a certain range. Temporal frequency components from the Fourier Transform of a low-pass filtered PD image for a given slice is one approach to generate a mask image. It is contemplated that in another embodiment, a "speed" image may be used to generate the mask image for background phase suppression. This speed image may be constructed from the individual vector velocity components along each direction of flow. Since with PC imaging is it possible to encode flow in three orthogonal directions, it is possible to determine velocity components along the three directions. The speed image can then be determined from the square root of the sum of the squares of each of the velocity components.

The present invention was demonstrated with CINE PC scans of the descending aorta of a volunteer using a SIGNA® EXCITE® 1.5T system equipped with EchoSpeed Plus™ gradients and commercially available from GE Healthcare, Waukesha, Wis. SIGNA and EXCITE are registered trademarks of General Electric Co., Fairfield, Conn. Data was acquired with a TE/TR=3.1/6.5 msec, VENC=100 cm/msec, oblique axial plane with flow encoding in the slice direction, 6 views per segment, heart rate=58 beats per minute, 32×24 cm FOV, 256×192 matrix, ±31.25 kHz bandwidth, 20° flip angle, and PD reconstruction. The effects of eddy currents were simulated by overcompensation of a digital pre-emphasis system. Three different eddy current settings were compared: (i) no additional compensation, (ii) 0.5% overcompensation of the Z→X cross-term, and (iii) 0.5% overcompensation of the Z→Y cross-term. The time constraints of all eddy currents were set equal to the TE to maximize effect. Reference phantom data was also acquired for comparison of each of the three eddy current settings. The PD data was corrected for background phase using a known global correction that does not distinguish between flow and background, the invention correction technique described herein, and the phantom reference correction. Flow through the descending aorta was then calculated using a region of interest around the aorta that included all pixels within 50% of the maximum magnitude pixel.

Figure 3:
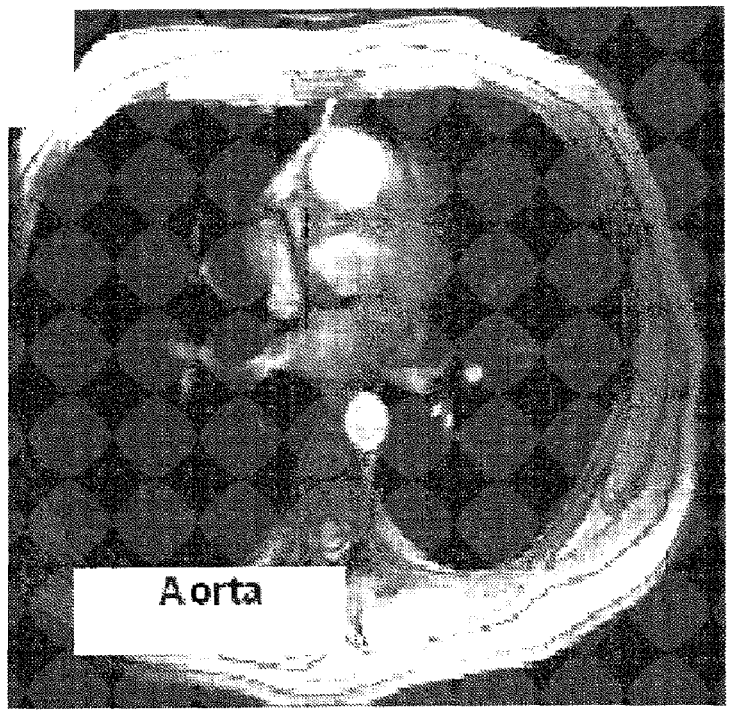
FIG. 3 is a magnitude image reconstructed from image data acquired with a Y eddy current at a trigger delay of 216 msec corresponding to peak systolic flow.
Figure 4:
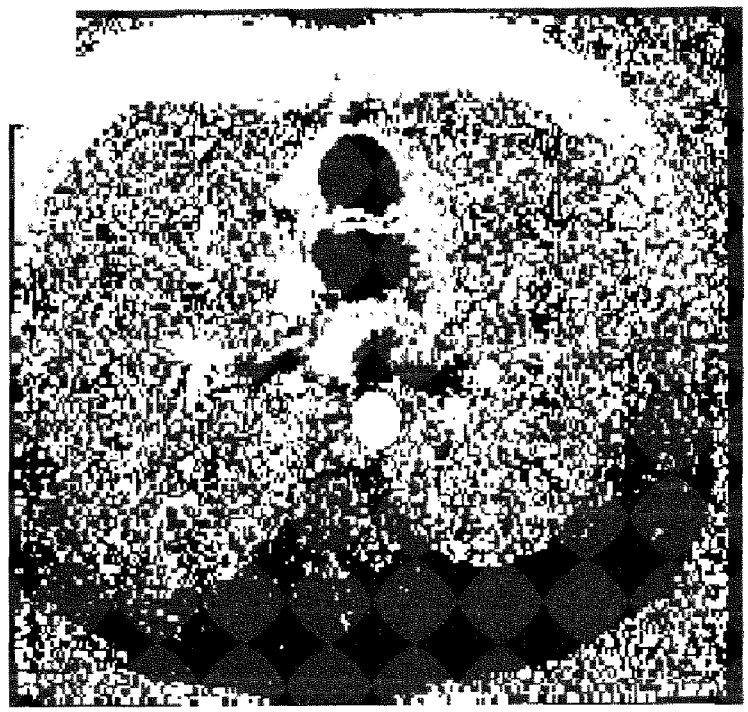
FIG. 4 is an uncorrected PD image.
Figure 5:
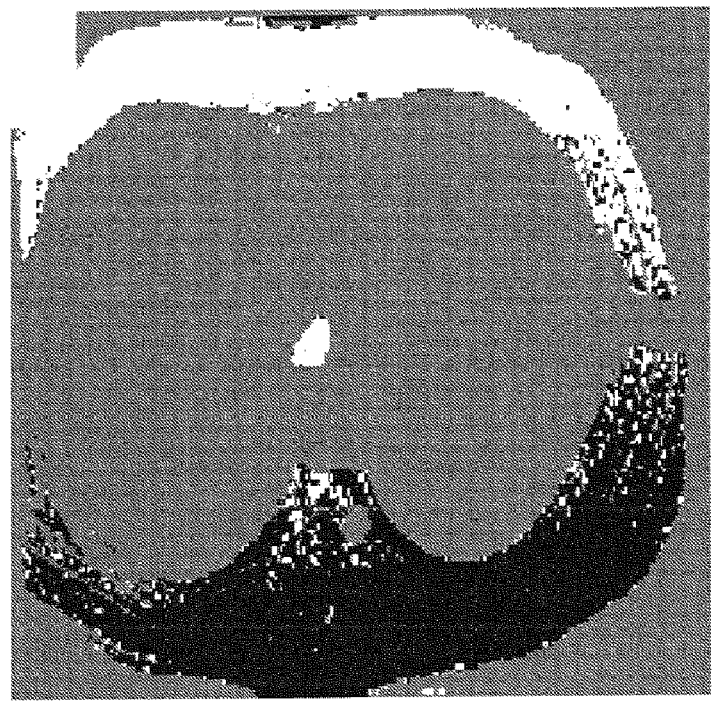
FIG. 5 is a mask image reconstructed from those pixels having a pulsatility factor less than a given value in accordance with the present invention.
Figure 6:
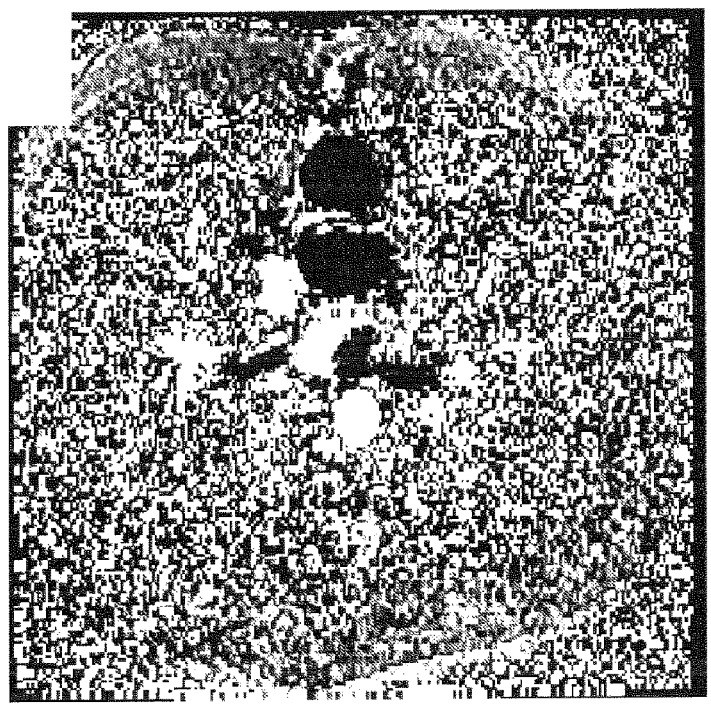
FIG. 6 is a corrected PD image masked by the mask image of FIG. 5.

FIG. 3 is a magnitude image reconstructed from image data acquired with a Y eddy current at a trigger delay of 216 msec corresponding to peak systolic flow. FIG. 4 is an uncorrected PD image. FIG. 5 is a mask image reconstructed from those pixels having a pulsatility factor less than 0.15. FIG. 6 is a corrected PD image masked by the mask image of FIG. 5. From the images of FIGS. 3-6 it is apparent that the correction technique of the present invention effectively removes background phase without being affected by flow induced phase. In this regard, the present invention provides an automated technique for correcting residual background phase independent of flow related phase.

Figure 7:
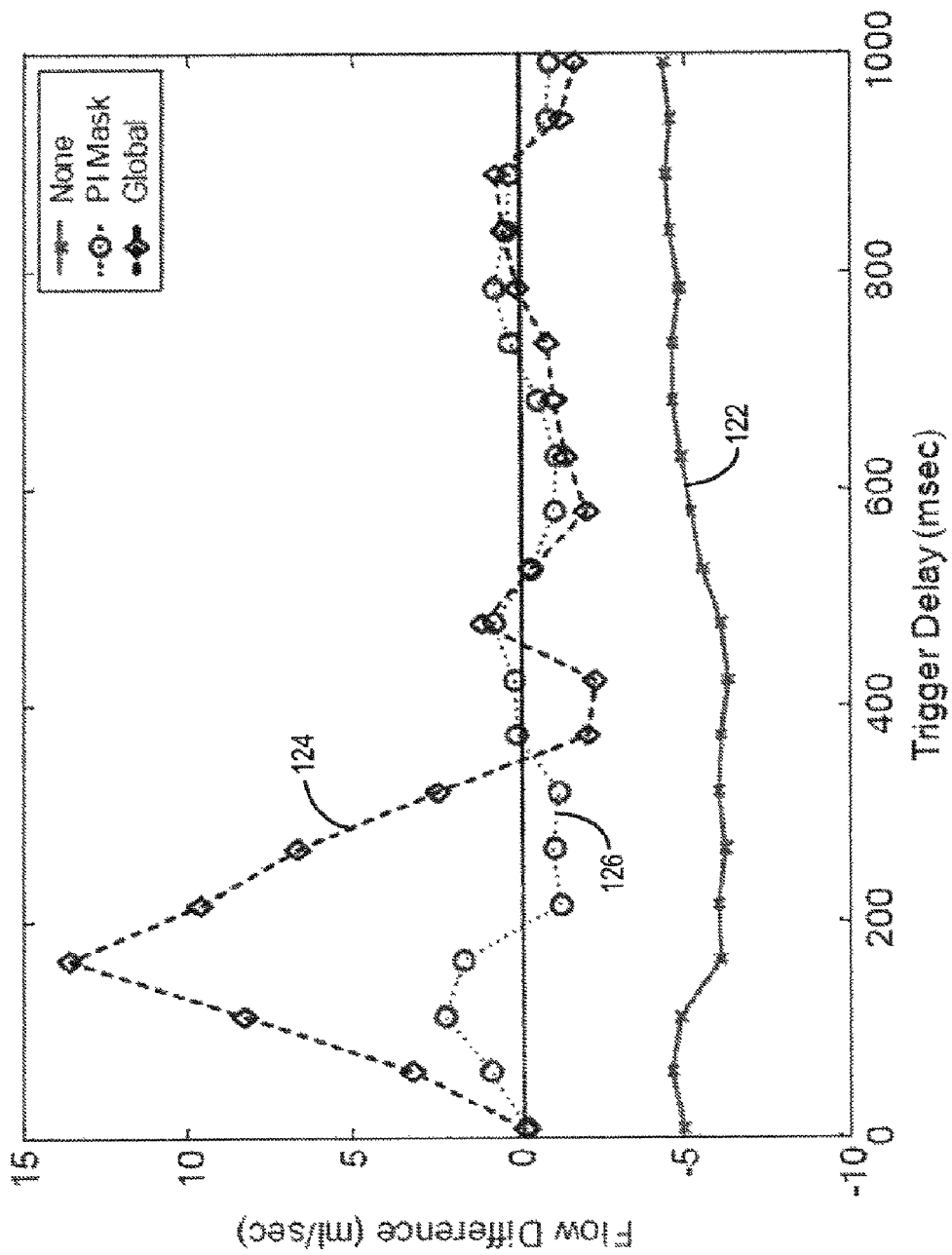
FIG. 7 is a line graph comparing measured flow without background phase correction, a known phantom-based global correction, and a mask correction according to the present invention.

Referring now to FIG. 7, a line graph compares the measured flow in an exemplary descending aorta using no correction 122, a global correction to a phantom reference corrected flow measurement 124, and the mask correction 126 using the inventive technique described above. The phantom reference corrected measurement repeats the in vivo prescription in a phantom to determine the background phase. This phase is then subtracted from the corresponding in vivo data. The global correction 124 fits all of the data in the PD image to a second order phase including regions of flow. The mask correction plot 126 corresponds to background suppression using a PI value of 15%. As illustrated, without any correction the measured flow tends to underestimate the volume flow rate by about 5 ml/sec (−5.26+/−0.71 ml/sec). The global correction is heavily distorted by the actual flow with up to a 15 ml/sec overestimation of flow during systole (1.63+/−4.46 ml/sec). In contrast the mask correction technique of the present invention is much less dependent on flow with an average error of −0.07+/−0.99 ml/sec.

While the present invention has been described with particular reference to phase-based segmentation, it is recognized that a similar approach can be carried out in accordance with a magnitude-based segmentation approach. In this regard, objects are identified based on magnitude, i.e. shape, rather than phase variations. From their identification, objects are either included or excluded in a mask image. Similar to that described above, the mask image may then be applied to a PD image to determine background phase in the PD image and, ultimately, subtract the background phase from the PD image.

Therefore, an MR scanner is disclosed and includes an MRI system having a plurality of gradient coils positioned about a bore of a magnet to impress a polarizing magnetic field and an RF transceiver system. The MR scanner also includes a computer programmed to generate PD images from a first acquisition and a second acquisition and determine a non-zero spatially varying background phase from the PD images that are due to eddy currents induced by flow encoding gradients used to generate the PD images. The computer is also programmed to remove the non-zero spatially varying background phase from the PD images and determine phase associated with flowing spins and phase associated with stationary spins.

A method of phase correction in flow analysis MR imaging is also disclosed. The method includes determining temporal frequency components for a given pixel of a phase-difference image. The method also includes generating a power spectrum of the given pixel from the temporal frequency components and determining a percentage of the power spectrum within a given energy range. The method also includes the step of including the pixel in a mask image if a given percentage of the power spectrum for the pixel is at a given energy.

The invention may also be embodied in a computer program stored on a computer readable storage medium and having instructions which, when executed by a computer, cause the computer to determine a pulsatility factor for each pixel of a slice of a PD image. The computer is also caused to generate a mask image of the slice from only those pixels having a given pulsatility factor and apply the mask image to the phase-difference image for the slice to mask the PD image along the slice. The set of instructions further causes the computer to reiterate these acts for each slice of the PD image and output a corrected PD image with substantial subtraction of background phase.

The present invention has been described in terms of the preferred embodiment, and it is recognized that equivalents, alternatives, and modifications, aside from those expressly stated, are possible and within the scope of the appending claims.

What is claimed is:

1. An MR system comprising:
   a magnetic resonance imaging (MRI) system having a plurality of gradient coils positioned about a bore of a magnet to impress a polarizing magnetic field and an RF transceiver system to acquire MR images; and
   a computer programmed to:
   determine a non-zero background phase, from phase-difference image data, that is due to eddy currents induced by flow encoding gradients, wherein the non-zero background phase is calculated based on a degree of pulsatility within an object being imaged; and
   remove the non-zero background phase from the phase-difference image data.

2. The MR system of claim 1 wherein the computer is further programmed to:
   determine phase associated with flowing spins and phase associated with stationary spins; and
   reconstruct a phase contrast image with contrast between flowing spins and stationary spins.

3. The MR system of claim 1 wherein the computer is further programmed to:
   determine the degree of pulsatility of the object;
   compare the degree of pulsatility to a pulsatility threshold; and
   determine inclusion of the object in a background image from the comparison.

4. The MR system of claim 3 wherein the computer is further programmed to exclude the object in the background image if the degree of pulsatility of the object exceeds the pulsatility threshold.

5. The MR system of claim 3 wherein the computer is further programmed to determine inclusion of the object in a background image on a per slice basis.

6. The MR system of claim 1 wherein the computer is further programmed to generate a mask image from those objects not pulsating at a temporal frequency above a frequency threshold.

7. The MR system of claim 6 wherein the computer is further programmed to generate a temporal frequency power spectrum on a per pixel basis, and if a given fraction of the temporal frequency power spectrum for a given pixel exceeds the frequency threshold, exclude the given pixel from inclusion in the mask image.

8. The MR system of claim 7 wherein the computer is further programmed to exclude a pixel from inclusion in the mask image if more than 15 percent of pixel energy is at or above the frequency threshold.

9. The MR system of claim 6 wherein the computer is further programmed to subtract the mask image from a phase-difference image to remove that portion of the phase-difference image corresponding to background phase.

10. The MR system of claim 9 wherein the computer is further programmed to remove background phase from the phase-difference image for each phase of a cardiac cycle.

11. A method of phase correction in flow analysis MR imaging comprising the steps of:
    determining temporal frequency components for a pixel;
    generating a power spectrum of the pixel from the temporal frequency components;
    determining percentage of the power spectrum at or above a given energy range; and
    including the pixel in a mask image if a percentage of the power spectrum is at a given energy.

12. The method of claim 11 further comprising the step of including the pixel in the mask image if less than 15 percent of the power spectrum for the pixel is at the given energy.

13. The method of claim 11 further comprising the step of applying the mask image to the phase-difference image and generate a set of masked phase-difference pixels.

14. The method of claim 13 further comprising the steps of:
    determining a set of fit coefficients of a representative polynomial expression from the set of masked phase-difference pixels;
    determining background phase in the phase-difference image from the set of fit coefficients subtracting background phase from the phrase-difference image and generating a corrected phase-difference image; and generating a corrected phase-difference image for each slice of a plurality of imaged slices.

15. The method of claim 11 further comprising the steps of:
summing the temporal frequency component for a first harmonic and the temporal frequency component for a second harmonic of the power spectrum for the given pixel and normalizing the sum to a maximum pixel value of the phase-difference image;
comparing the value of normalization for the given pixel to a threshold and determining inclusion of the given pixel in the mask image from the comparison; and
applying a pre-selected threshold to determine inclusion of the given pixel in the mask image.

16. A computer readable storage medium having a computer program stored thereon and representing a set of instructions that when executed by a computer causes the computer to:
(A) determine a pulsatility factor for at least one pixel of a phase-difference image;
(B) generate a mask image of the slice from pixels of the at least one pixel having a given pulsatility factor;
(C) apply the mask image to the phase-difference image to mask the phase-difference image along a slice; and
(D) output a slice of a corrected phase-difference image with substantial subtraction of background phase.

17. The computer readable storage medium of claim 16 wherein the set of instructions further causes the computer to apply the mask for each cardiac phase of a measurement period.

18. The computer readable storage medium of claim 16 wherein the set of instructions further causes the computer to determine background phase in the phase-difference image with perturbation as a function of inflowing spins along the slice.

19. The computer readable storage medium of claim 18 wherein the set of instructions further causes the computer to calculate quantitative flow measurements to access flow velocities in vivo.

20. The computer readable storage medium of claim 16 wherein the set of instructions further causes the computer to low pass filter the phase-difference image and Fourier transform the filtered phase-difference image to determine temporal frequency components for each pixel.

* * * * *